United States Patent [19]
Wiszniewski

[11] Patent Number: 5,682,053
[45] Date of Patent: Oct. 28, 1997

[54] SILICON TRANSDUCER WITH COMPOSITE BEAM

[75] Inventor: Witold Wiszniewski, Turramurra, Australia

[73] Assignee: AWA MicroElectronics Pty. Limited, Homebush, Australia

[21] Appl. No.: 588,290

[22] Filed: Jan. 18, 1996

Related U.S. Application Data

[63] Continuation of Ser. No. 40,253, Mar. 30, 1993, abandoned.

[30] Foreign Application Priority Data

Mar. 30, 1992 [AU] Australia .................. PL1610

[51] Int. Cl.⁶ .................................................. H01L 29/82
[52] U.S. Cl. .......................... 257/401; 257/417; 257/418; 257/419; 257/522; 257/619; 257/930; 73/514.21; 73/514.22; 73/514.36; 73/DIG. 1
[58] Field of Search ..................... 257/930, 619, 257/622, 417, 418, 419, 466, 467, 470, 522, 401; 73/DIG. 1, 514.21, 514.22, 514.36

[56] References Cited

U.S. PATENT DOCUMENTS

| 5,245,504 | 9/1993 | Bullis et al. ................. 361/283.4 |
| 5,324,683 | 6/1994 | Firh et al. .......................... 437/65 |

FOREIGN PATENT DOCUMENTS

| 0 169 519 | 1/1986 | European Pat. Off. . |
| 0169519 | 1/1986 | European Pat. Off. . |
| 0 271 062 | 6/1988 | European Pat. Off. . |
| 0271062 | 6/1988 | European Pat. Off. . |
| 2034970 | 6/1980 | United Kingdom . |
| 2151398 | 7/1985 | United Kingdom . |
| 2194344 | 3/1988 | United Kingdom . |

*Primary Examiner*—William Mintel
*Attorney, Agent, or Firm*—Marshall, O'Toole, Gerstein, Murray & Borun

[57] ABSTRACT

A simox wafer includes substrate (1), simox silicon dioxide layer (2) and monocrystalline simox silicon layer (3). An additional silicon nitride layer (5) is deposited on top of silicon layer (3) to allow the fabrication of a monocrystalline beam (4) by selectively etching the dioxide layer (2). The thermal insulating property of the resultant beam (4) offers an ideal site for construction of thermocouples (29), light modulators (60) and active components such as p-n diodes (34), MOS transistors (47) and bipolar transistors.

22 Claims, 6 Drawing Sheets

SILICON TRANSDUCER WITH COMPOSITE BEAM

This is a Continuation of U.S. application Ser. No. 08/040,253, filed Mar. 30, 1993, now abandoned.

The present invention relates to a method of fabricating silicon microstructures and, more particularly, silicon transducers.

BACKGROUND OF THE INVENTION

The fabrication of silicon microstructures is well known. In one application, for example an infrared detector, infrared radiation is absorbed by a sensor producing heat which raises the sensor temperature. In order to obtain a maximum temperature rise, the sensor must be thermally insulated from its surroundings. Sensors made using IC technology employ micromechanical structures such as beams, cantilevers or membranes which provide increased thermal isolation for a sensor located on the structure.

Conventional microelectronic fabrication techniques, which utilise polycrystalline or amorphous silicon deposited on top of a silicon substrate, produce beams of poor mechanical strength. Furthermore, the polycrystalline structure prevents the incorporation of active components in the beam. A monocrystalline microstructure would be highly desirable for its more predictable mechanical properties and because it would allow the inclusion of active components to tailor its response to specific stimuli.

A suitable starting material for the fabrication of monocrystalline microstructures is the so called SIMOX wafer. The term SIMOX stands for Separation by IMplanted OXygen and derives from the known technique of deep implanting oxygen ions into a silicon substrate to form an oxide layer separating the substrate from a top silicon layer, while preserving the monocrystalline form of the silicon layer.

It is an object of the present invention to provide a method of fabricating monocrystalline silicon microstructures which overcomes, or at least ameliorates, the disadvantages of the prior art.

SUMMARY OF THE INVENTION

The present invention, in a first aspect, consists in a method for fabricating monocrystalline silicon microstructures, wherein the method includes the steps of:
- forming isolation regions in a silicon wafer of the type having a substrate and a monocrystalline silicon layer separated by a buried silicon dioxide layer, the isolation regions being located in the silicon layer;
- depositing a silicon nitride layer on the silicon layer of the wafer;
- opening first contact windows through the silicon nitride layer to allow electrical connection to the silicon layer;
- depositing and patterning a first metal layer to provide electrical connection to the silicon layer;
- etching through both the silicon nitride layer and the silicon layer to provide access to the buried silicon dioxide layer; and
- etching the buried silicon dioxide layer to leave a self-supporting silicon microstructure composed of monocrystalline silicon and silicon nitride.

Preferably, at least one pair of grooves is etched through both the silicon nitride and silicon layers and thereafter the silicon dioxide layer is etched between the or each pair of grooves such that the or each self-supporting silicon microstructure is a beam.

Preferably also, between the steps of forming isolation regions in the silicon layer and depositing a silicon nitride layer, the method includes the step of annealing the wafer.

In a preferred form, the silicon layer and the silicon nitride layer are separated by a thin silicon dioxide layer. More preferably, appropriate doping of either or both of the silicon layer and the substrate occurs for facilitating the subsequent formation of active components in either or both of the substrate and the silicon layer. Even more preferably, such components are selected from: p-n junctions; MOS transistors; and, bipolar transistors.

According to a second aspect of the invention there is provided a silicon microstructure formed from a silicon wafer of the type having a substrate and a monocrystalline silicon layer separated by a buried silicon dioxide layer which includes a cavity, the microstructure including a composite beam spanning said cavity and having adjacent silicon and silicon nitride layers, the beam being self supporting.

Preferably, the beam extends longitudinally across said cavity between two ends and includes a transverse width less than the transverse width of said cavity. More preferably, the ends of the beams are respectively electrically accessible byway of contacts.

Preferably also, the beam includes doped regions within the silicon layer for forming at least one active component selected from the following: p-n junction diode; MOS transistor; and, bipolar transistor. More preferably, a voltage is able to be applied to the substrate to modify the electrical properties of said beam.

DESCRIPTION OF THE DRAWINGS

Preferred embodiments of the present invention will now be described, by way of example only, with reference to the accompanying diagrams in which.

DESCRIPTION OF THE PREFERRED EMBODIMENTS

Figure 1:
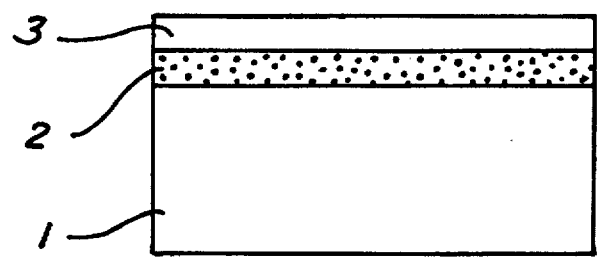
FIG. 1 shows the cross-section of a SIMOX wafer.

Referring now to FIG. 1 there is illustrated a cross-section of a SIMOX wafer with substrate 1, SIMOX silicon dioxide layer 2 and monocrystalline SIMOX silicon layer 3.

Figure 2:
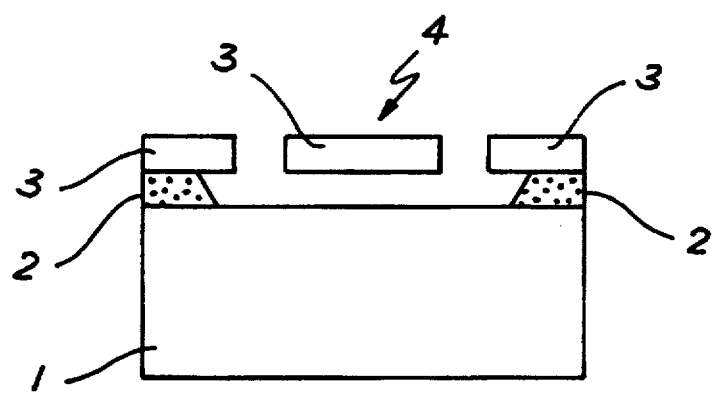
FIG. 2 shows in cross-section a simple silicon beam produced by selective removal of SIMOX oxide from the wafer of FIG. 1.
Figure 3:
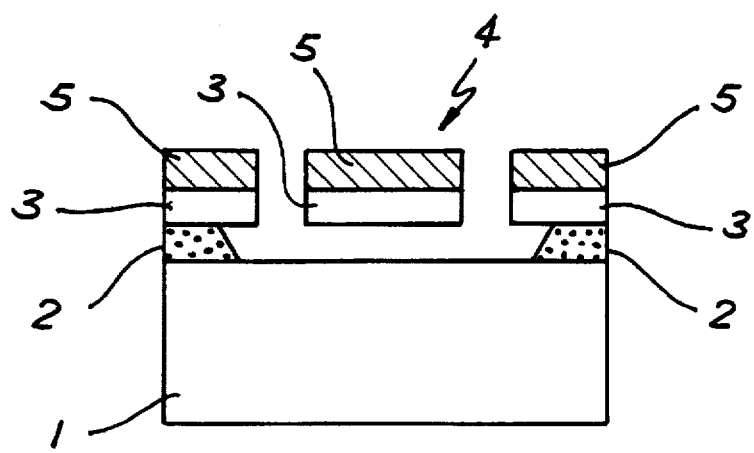
FIG. 3 shows a cross-section of a composite silicon and silicon nitride beam in accordance with the present invention.

A monocrystalline beam 4 can be fabricated in such a wafer by selectively etching the SIMOX dioxide layer 2, as shown in FIG. 2, but this still lacks sufficient mechanical strength for many applications. In order to increase the strength of the beam 4, an additional silicon nitride layer 5 is deposited on top of the SIMOX silicon layer 3, as best shown in FIG. 3. The resulting composite beam is stronger and does not easily deform. In other embodiments layers 3 and 5 are separated by a thin intermediate silicon dioxide layer (not shown).

Composite beams can be manufactured with a thickness between 0.1 and 1 μm and a length of at least 100 μm. These values are not obtainable by any other manufacturing method. Silicon beams made using previously known methods merely collapse on the substrate when fabricated to half this length. It will be appreciated that beams having a very short span are also able to be manufactured in accordance with the invention.

Figure 4:
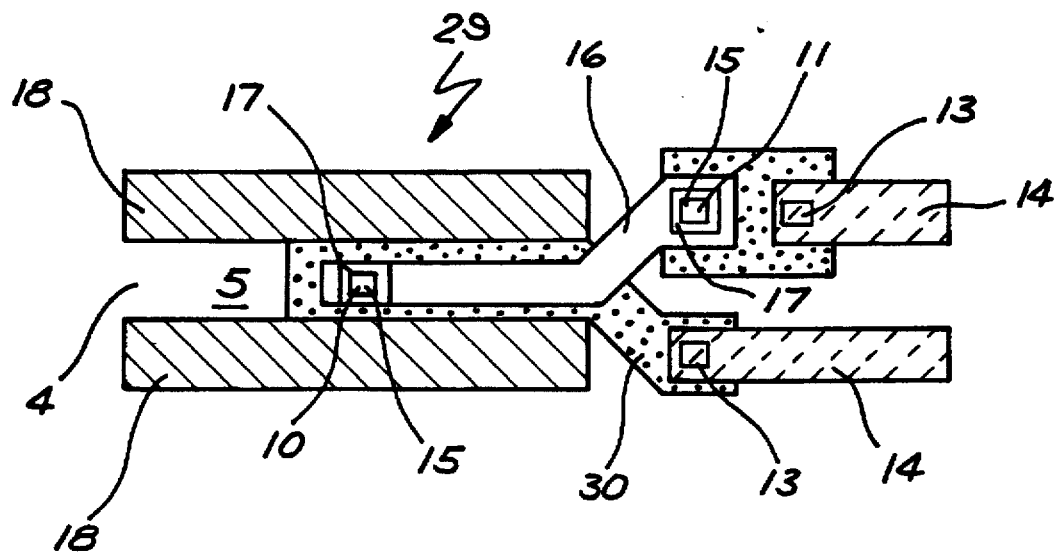
FIG. 4 shows in plan view a thermocouple fabricated according to a first preferred embodiment of the present invention.

In a first preferred embodiment of the present invention, that of an infrared thermal detector, the thermocouple 29 shown in FIG. 4 is constructed with a SIMOX silicon layer 30 as the first thermocouple leg and an ultra-thin platinum layer 16 as the second leg. The hot junction 10 of the thermocouple is positioned close to the middle of the beam 4 for thermal isolation and the cold junction 11 is located within the body of the silicon adjacent the beam. The platinum 16, in addition to providing the second thermocouple leg, acts as an absorber layer for infrared radiation.

Figure 6:
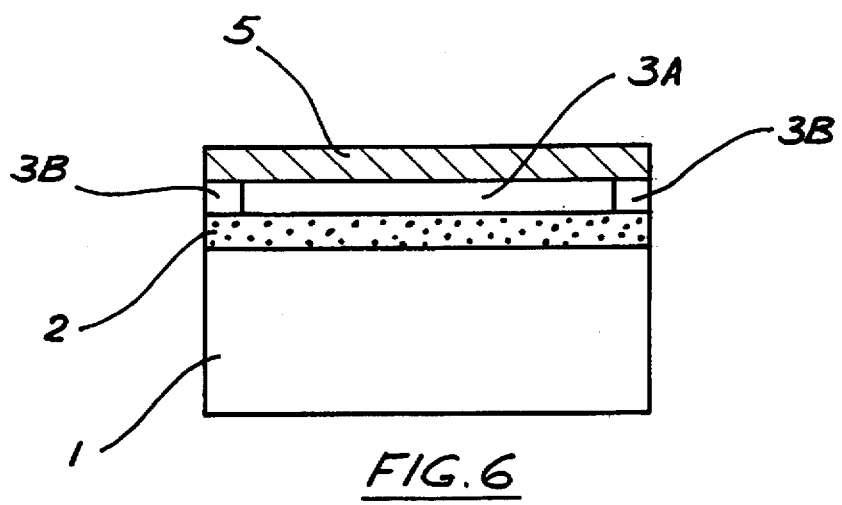
FIG. 6 shows a SIMOX wafer in cross-section following ion implantation to form isolation regions in the silicon layer and deposition of a silicon nitride layer.

The starting material of the present invention is the SIMOX wafer as shown in FIG. 1. In the first steps, p+ and n+ isolation regions (not shown) are created in the SIMOX silicon using ion implantation. Phosphorous is used as the donor impurity and boron as the acceptor impurity. After a high temperature anneal, a layer of silicon nitride 5 is deposited by low pressure chemical vapor deposition (LPCVD) techniques. A cross-section of the SIMOX wafer at this stage of fabrication is shown in FIG. 6. In the Figure, a silicon substrate 1 supports a SIMOX oxide layer 2 and a SIMOX silicon layer 3 divided into p+ regions and n+ regions 3a and 3b respectively. Above layer 3 a silicon nitride layer 5 is deposited.

Figure 7:
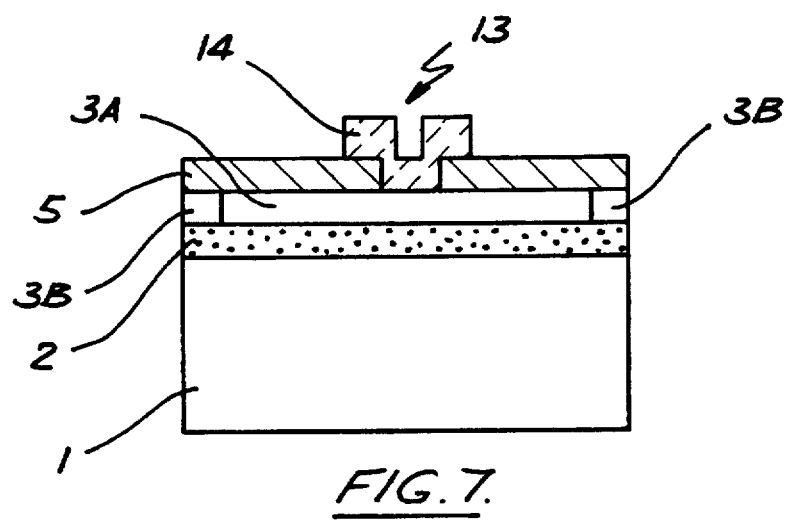
FIG. 7 shows the SIMOX wafer of FIG. 6 in cross-section after first contact etch and first metal deposition.

Fabrication continues with a first contact etch, using plasma etch methods, which opens first contact windows through the silicon nitride layer 5 to provide a site for first contacts 13. The etch is followed by aluminum deposition and a further plasma etch. These steps create a first metal layer 14 as the output connection of the infrared thermal detector. A cross-section of one of the first contacts 13 appears in FIG. 7. A plan view of both first contacts is shown in FIG. 4.

Figure 8:
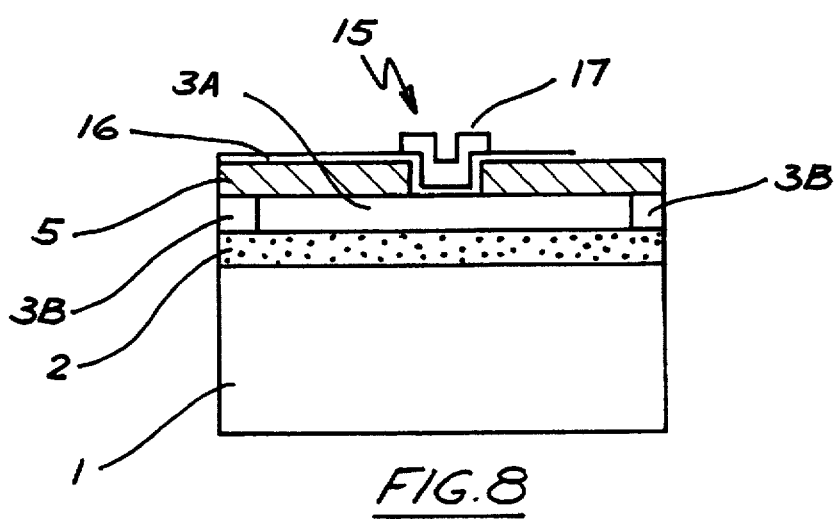
FIG. 8 shows the SIMOX wafer of FIG. 6 in a further cross-section after second contact etch and second and third metal deposition.

In the next step, second contacts 15 are opened in a similar manner. The second contacts form the hot and cold junctions 10 and 11 respectively of the thermocouple shown in FIG. 4, this time however, platinum 16 is deposited as the second metal layer using lift-off techniques. As the platinum layer is very thin, about 50 angstroms, a third metal layer 17 is required in and around the second contact on top of the second metal layer. This ensures proper metal continuity over the contact edges. Titanium is used for the third metal layer 17 and it is also patterned by a lift-off process. The cross-section of one of the second contacts 15 from FIG. 4 is shown in FIG. 8.

Figure 9:
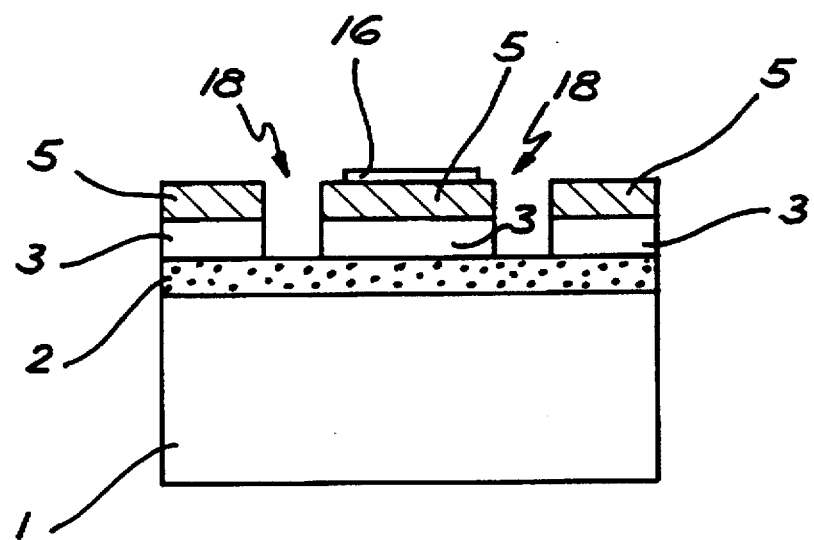
FIG. 9 shows the wafer of FIG. 6 in a still further cross-section after the opening of etch grooves.

The next step is the opening of etch grooves 18 by plasma etch. FIG. 9 shows a cross-section of a composite silicon beam fabricated in accordance with the preceding steps and before the buried SIMOX oxide layer 2 is removed.

Figure 10:
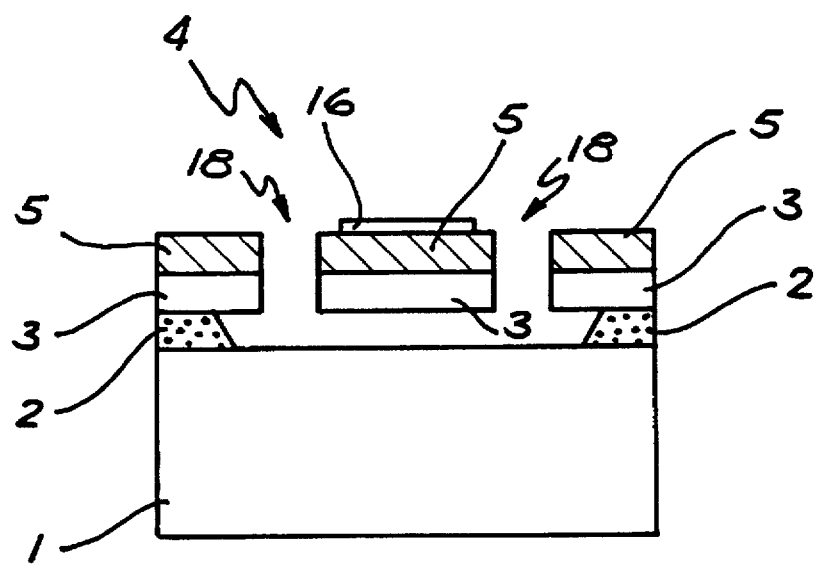
FIG. 10 shows the wafer of FIG. 6 and FIG. 9 after final etch.

The last step of the process is therefore the final etch which locally removes at least substantially all the SIMOX oxide layer from beneath the beam to leave a self supporting structure. The final etch is performed in a liquid solution of hydrofluoric acid. A partial cross-section of the finished thermal detector is shown in FIG. 10.

Figure 5:
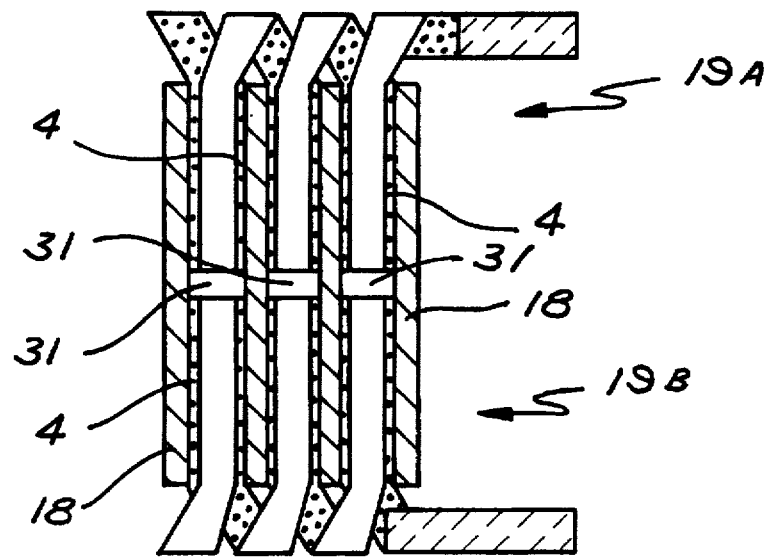
FIG. 5 shows a multiple thermocouple array fabricated according to a first preferred embodiment of the present invention.

A thermal detector may consist of one or more thermocouples. FIG. 5 shows a multi-thermocouple detector or thermopile. Each beam 4 of the thermopile includes two thermocouples 19a, 19b, one at each end of the beam. Once more, the hot junctions 31 of each thermocouple are located in the middle of the beam. The thermocouples are connected in series to produce an array. It will be appreciated that this array can include more or less of the thermocouples, as required.

Figure 11:
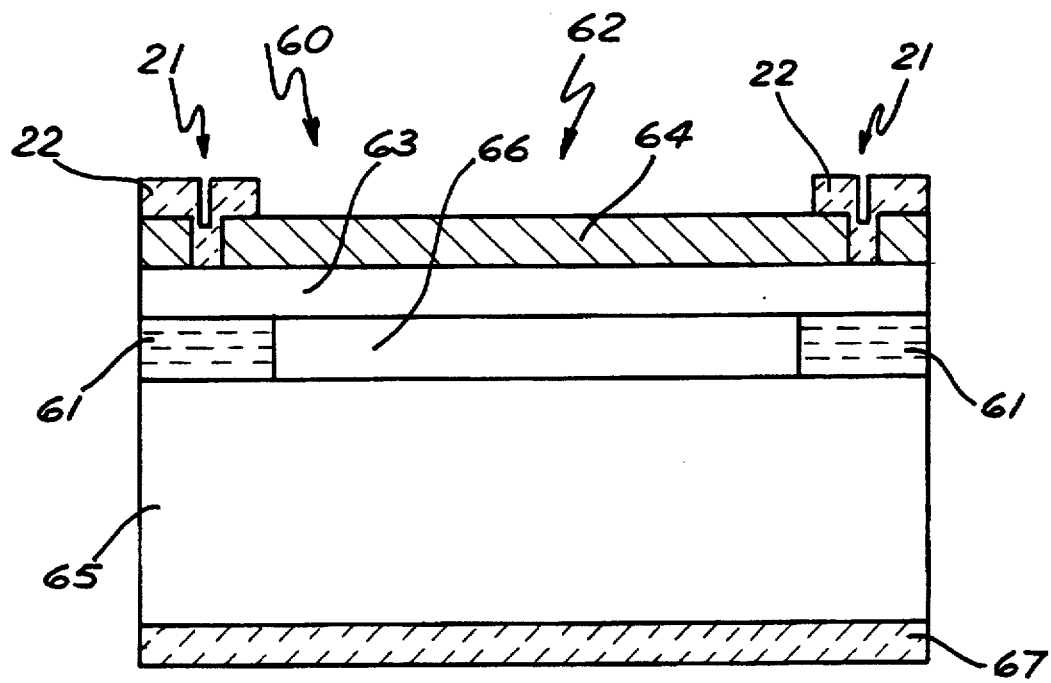
FIGS. 11 and 12 show in cross-section a light modulator fabricated according to a second preferred embodiment of the present invention.
Figure 12:
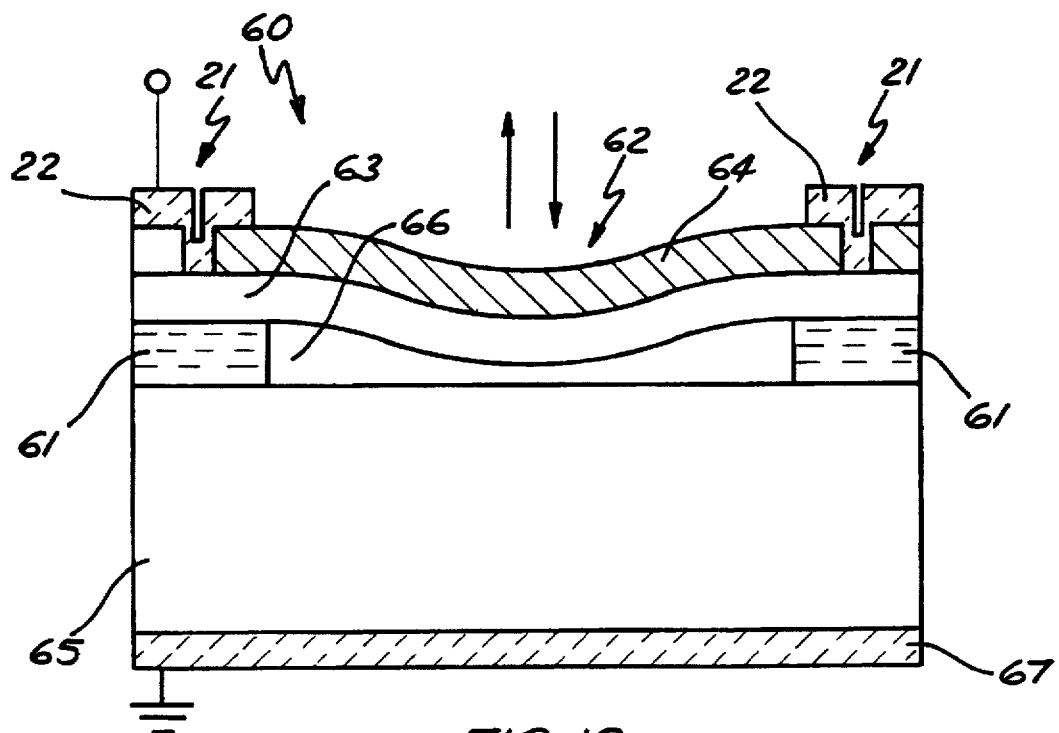

A second preferred embodiment of the present invention is that of a light modulator 60 in which the composite beam 62, having a monocrystalline silicon layer 63 and a silicon nitride layer 64, is supported by an etched SIMOX silicon dioxide layer 61 and adapted for electrostatic deflection to vary the beam's separation from the substrate 65. Such a modulator is best illustrated in FIGS. 11 and 12.

It is well known that the varying thicknesses of silicon dioxide on top of a silicon wafer create interference patterns which cause light to be reflected as different colors. The apparent coloration of areas of 'blank' silicon is often observed, most clearly through a microscope. This effect is not to be confused with diffraction of the light by the regular patterns of small structures, also familiar to those skilled in the art.

The first mentioned effect is caused by the constructive interference of some wavelengths of light and the destructive interference of others as incident light passes through the silicon dioxide and is reflected from the underlying silicon surface.

The same effect is used to advantage in the second preferred embodiment of the present invention, such that incident light passes through the substantially transparent composite silicon/silicon nitride beam 62, and the cavity 66 beneath, to be reflected back by the substrate. If the beam is made to deflect, its separation from the substrate and the light wavelength at which the desired interference occurs can be varied.

Further, when the incident light is monochromatic and of suitable wavelength, the invention in this embodiment may be used to modulate the intensity of the light reflected and to function as an optical switch.

FIGS. 11 and 12 show such a light modulator with the beam in an undeflected and a deflected state, respectively. The silicon substrate 65 is provided with an aluminium back electrode 67 to allow a potential to be developed between the substrate and the silicon beam. Once again, a silicon nitride layer 64 provides structural strength. Contact holes 21 and aluminum interconnects 22 allow a modulating voltage to be applied as shown in FIG. 12.

The method of fabrication corresponds to that of the previously described embodiment, except that aluminum alone is used as a metal layer.

It will be appreciated that the beam 62 need not take the form of a rectangular prism, as shown in FIGS. 4 and 5, indeed it may be more appropriate to vary the beam cross-section so that, in the second preferred embodiment for example, interference effects are apparent over a greater area.

Figure 13:
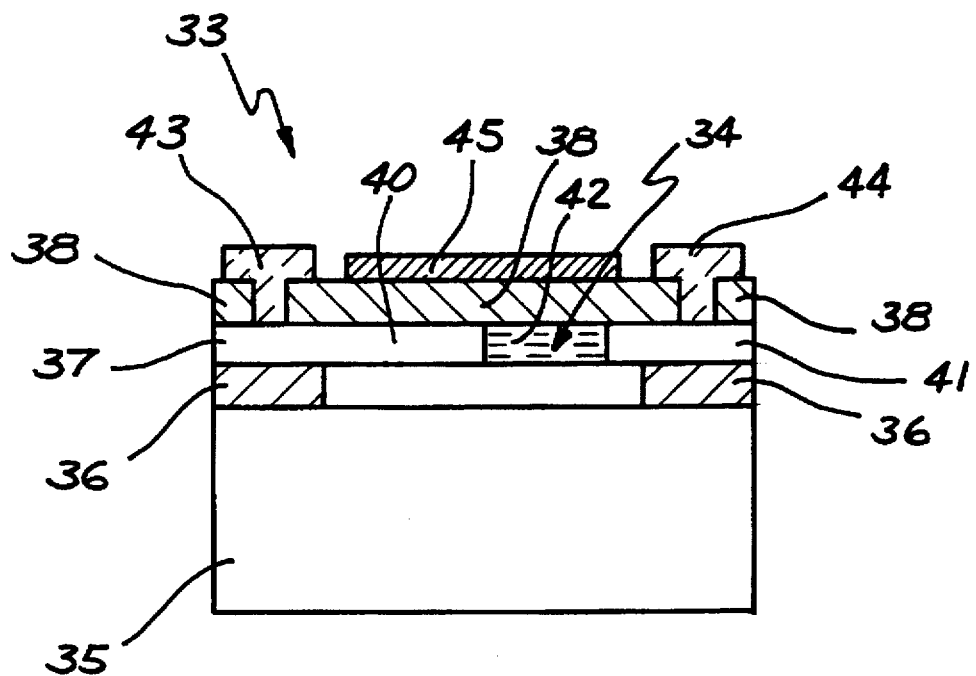
FIG. 13 shows the cross-section of a p-n diode infra-red detector fabricated in accordance with the invention.

Referring to FIG. 13 a cross-section of a third preferred embodiment of the invention is illustrated and includes an infra-red detector 33 based on a thermally isolated p-n diode 34. Detector 33 includes a base formed by substrate 35 and additional SIMOX silicon dioxide layer 36 and monocrystalline SIMOX silicon layer 37. A silicon nitride layer 38 is formed on layer 37, and as described above, etching of layer 36 occurs to provide a self supporting beam comprised by layers 37 and 38.

Additionally, to achieve the p-n junction, layer 37 is appropriately doped to form a p+ silicon region 40, an n+ silicon region 41 and an intermediate n silicon region 42. Both regions 40 and 41 can be electrically connected with other componentry via metalizations 43 and 44 which are established through layer 38. A thin platinum layer 45 is deposited on layer 38 and acts as an infra-red absorber.

This form of infra-red detector is more sensitive than the thermocouple described above due to lightly doped n region 42. That is, the thermoelectrical effect is much greater than for the p+ and metal junction as used in the thermocouple. Furthermore, direct absorption of infra-red radiation in the depletion layer of the p-n junction allows detector 33 to operate as both a thermal and quantum detector.

The detector is advantageously located such that the p-n junction is located in the center of the beam in order to provide a maximum available thermal isolation.

Figure 14:
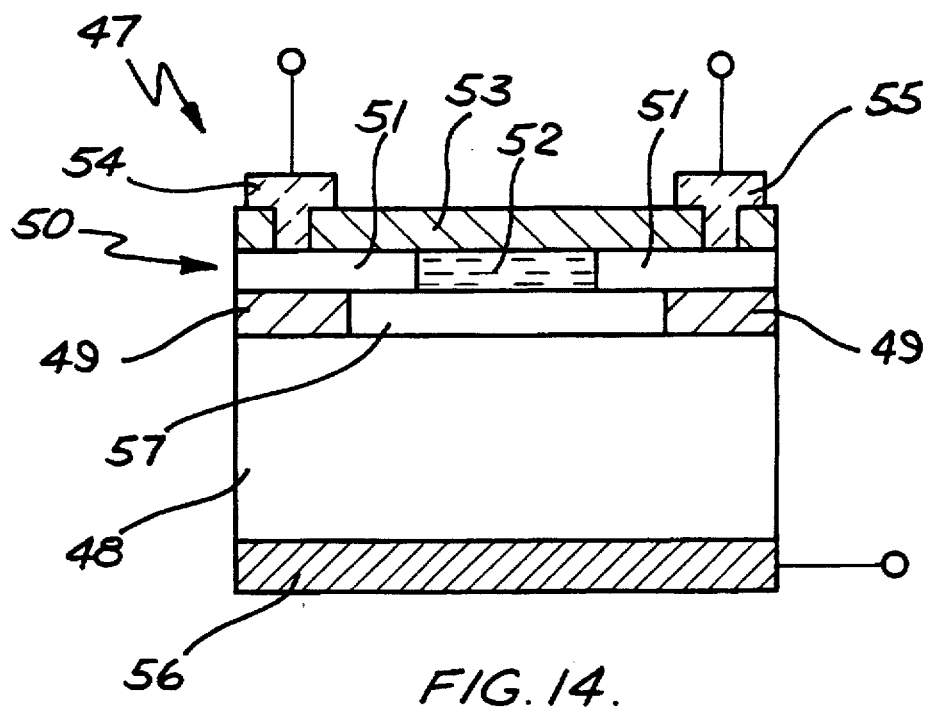
FIG. 14 shows the cross-section of a sensor MOS transistor also fabricated in accordance with the invention.

Reference is now made to FIG. 14 where there is illustrated a cross-sectional view of a sensor MOS transistor 47 constructed in accordance with the invention and which is hereinafter referred to as an SMOS transistor. Transistor 47 includes a silicon substrate 48, an etched SIMOX silicon dioxide layer 49, a doped SIMOX silicon layer 50 having two spaced apart p+ regions 51 and an intermediate n region 52, and a silicon nitride layer 53. Transistor 47 is fabricated in accordance with the invention and layer 50 and silicon nitride layer 53 form a composite beam which is physically spaced from the underlying substrate by the unetched portions of layer 49.

Metalizations 54 and 55 define a source and drain contact respectively, while an aluminum metalization 56 on substrate 48 provides a gate contact.

Transistor 47 is used for selectively sensing one of a number of parameters such as vibration, temperature, infra-red radiation, acceleration or applied voltage. This is due to the cavity 57 between substrate 48 and layer 50 being analogous to the silicon dioxide layer in a prior art MOS transistor. That is, the substrate voltage is able to modulate the conductivity of layer 50.

The SMOS transistor is able to be either n-channel or p-channel, as required.

Although the above embodiments have been described with the inclusion of a single active component, a plurality of such components can be included on a single beam, if required.

Where the thermal isolating properties of the beam are paramount the cavity in the etched oxide layer is sealed under vacuum to minimise the thermal conductivity of the cavity.

Although reference has been made to specific examples of silicon transducers, it will be understood by those skilled in the art that the invention may be embodied in many other forms.

We claim:

1. A silicon microstructure comprising a silicon wafer having a substrate and a monocrystalline silicon layer separated by a buried silicon dioxide layer, said silicon dioxide layer including a cavity, said microstructure including a composite beam spanning said cavity and having adjacent silicon and silicon nitride layers, said beam being self-supporting.

2. A microstructure according to claim 1 wherein said beam extends longitudinally across said cavity between two ends and includes a transverse length less than the transverse length of said cavity.

3. A microstructure according to claim 2 wherein said ends of said beam are respectively electrically accessible by way of contacts.

4. A microstructure according to claim 2 wherein said beam includes doped regions within said silicon layer for forming active components selected from the following: p-n junction diode; MOS transistor; and bipolar transistor.

5. A microstructure according to claim 4 wherein a voltage is applied to said substrate to modify the electrical properties of said beam.

6. A microstructure according to claim 1 wherein said beam has a span of at least 50 μm.

7. A microstructure according to claim 4 wherein said beam has a span of at least 100 μm.

8. A microstructure according to claim 1 wherein said beam supports a thermojunction formed between said silicon layer of said beam and an adjacent metal layer.

9. A microstructure according to claim 8 wherein said metal layer is adapted to absorb infra-red radiation.

10. A microstructure according to claim 8 wherein said thermojunction is centrally disposed along said beam to facilitate thermal isolation from said substrate.

11. A microstructure according to claim 8 including a plurality of said thermojunctions which are electrically connected in series.

12. A microstructure according to claim 11 wherein each said thermojunction is formed in a respective beam spanning said cavity.

13. A microstructure according to claim 8 wherein said metal layer is platinum.

14. A microstructure according to claim 1 wherein said beam is at least partially transparent to a range of wavelengths of electromagnetic radiation, said microstructure also including actuation means to cause said beam to deflect and effect constructive and destructive interference between said radiation which is reflected from said cavity and said beam.

15. A microstructure according to claim 14 wherein said cavity has a depth comparable with said wavelengths in said range.

16. A microstructure according to claim 14 wherein said actuation means provides an electrical potential between the substrate and said beam to cause said beam to deflect.

17. A microstructure according to claim 16 wherein said voltage is varied to modulate said radiation.

18. A microstructure according to claim 14 wherein said actuation means mechanically deflects said beam.

19. A microstructure according to claim 1 wherein said beam supports at least one integrated semiconductor device.

20. A microstructure according to claim 19 wherein said device is a p-n junction diode formed in said silicon layer of said beam, said diode being responsive to electromagnetic radiation of a predetermined wavelength.

21. A microstructure according to claim 1 wherein said beam includes a metal layer for absorbing electromagnetic radiation of a predetermined wavelength.

22. A microstructure according to claim 21 wherein said predetermined wavelength lies in the infra-red range of wavelengths.

* * * * *